United States Patent
Lu

(10) Patent No.: US 11,869,813 B2
(45) Date of Patent: Jan. 9, 2024

(54) PLANARIZATION APPARATUS, PLANARIZATION PROCESS, AND METHOD OF MANUFACTURING AN ARTICLE

(71) Applicant: CANON KABUSHIKI KAISHA, Tokyo (JP)

(72) Inventor: Xiaoming Lu, Cedar Park, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 270 days.

(21) Appl. No.: 17/122,910

(22) Filed: Dec. 15, 2020

(65) Prior Publication Data

US 2022/0189832 A1 Jun. 16, 2022

(51) Int. Cl.
| | |
|---|---|
| *H01L 21/66* | (2006.01) |
| *H01L 21/67* | (2006.01) |
| *H01L 21/56* | (2006.01) |

(52) U.S. Cl.
CPC ............ *H01L 22/20* (2013.01); *H01L 21/565* (2013.01); *H01L 21/67126* (2013.01); *H01L 21/67253* (2013.01)

(58) Field of Classification Search
None
See application file for complete search history.

(56) References Cited

U.S. PATENT DOCUMENTS

| | | |
|---|---|---|
| 2006/0005657 A1 | 1/2006 | Choi et al. |
| 2010/0270705 A1 | 10/2010 | Okushima |
| 2017/0274418 A1 | 9/2017 | Shiode |
| 2017/0305043 A1 | 10/2017 | Shiode |
| 2019/0080922 A1 | 3/2019 | Khusnatdinov |
| 2019/0187575 A1 | 6/2019 | Lu |
| 2019/0196324 A1 | 6/2019 | Bamesberger |
| 2022/0189832 A1* | 6/2022 | Lu .................... G03F 7/0002 |

FOREIGN PATENT DOCUMENTS

| | | |
|---|---|---|
| JP | 2013131577 A | 7/2013 |
| JP | 2015050437 A | 3/2015 |
| JP | 6333035 B2 | 5/2018 |
| TW | 202038321 A | 10/2020 |

* cited by examiner

*Primary Examiner* — Jack S Chen
(74) *Attorney, Agent, or Firm* — Canon U.S.A., Inc., IP Division

(57) ABSTRACT

A method of real time leveling control between a superstrate and a substrate is provided. A contact force model indicating a relationship between a total contact force for planarization of a formable material between the superstrate and the substrate and a force component of the total contact force along each of a plurality peripheral axes is identified. A set point force required for performing the planarization is determined. Each force component is calculated based on the contact force model. The planarization is performed by applying each force component along a corresponding axis of the plurality of axes. The contact force model is identified based on a parallel condition between two contacting surfaces of a superstrate chuck for retaining the superstrate and a stack of the superstrate, the substrate, and formable material between the superstrate and the substrate.

16 Claims, 10 Drawing Sheets

PLANARIZATION APPARATUS, PLANARIZATION PROCESS, AND METHOD OF MANUFACTURING AN ARTICLE

BACKGROUND

Field of Art

The present disclosure relates to substrate processing, and more particularly, to the planarization process of surfaces in semiconductor fabrication.

Description of the Related Art

Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArF laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

SUMMARY

A method of real time leveling control between a superstrate and a substrate is provided. A contact force model indicating a relationship between a total contact force for planarization of a formable material between the superstrate and the substrate and a force component of the total contact force along each of a plurality peripheral axes is identified. A set point force required for performing the planarization is determined. Each force component is calculated based on the contact force model. The planarization is performed by applying each force component along a corresponding axis of the plurality of axes. The contact force model is identified based on a parallel condition between two contacting surfaces of a superstrate chuck for retaining the superstrate and a stack of the superstrate, the substrate, and formable material between the superstrate and the substrate. Each of the plurality of peripheral axes may extend in a parallel direction with respect to an axis in which a planarization head moves orthogonal to a reference plane. Each of the peripheral axes may be equidistant from a center of a superstrate chuck and are uniformly azimuthally distributed around a periphery of the stack of the superstrate, the substrate, and the formable material. The reference plane may be within 100 milliradians of parallelism with a top surface of a substrate chuck.

The above method may further include a step of estimating force components of the total contact force by measuring a force generated by an actuator along each of the plurality of peripheral axes at each of a plurality of positions along a first axis of the plurality of the peripheral axes; and adjusting the measured force to obtain an estimated contact force based on a calibrated spring forces caused by a mechanical compliance force and the parallel condition. The calibrated spring forces may also be estimated prior to performing planarization. For example, a planarization head including the superstrate chuck is moved to a first position above where the stack is to be located when planarization is being performed. Positions and information of applied control forces of the planarization head after the planarization head settling down to the first position are gathered. The planarization head is moved to a second position below where the stack will be located when planarization is being performed. Positions and applied forces information of the planarization head after the planarization head settling down to the second position are gathered. The spring force is then calibrated based on the position and applied forces information gathered from upward and downward movements of the planarization head. The spring forces may be calibrated by moving the planarization head and a substrate chuck for holding the substrate away from each other prior to moving the planarization head. The calibrated spring forces of the plurality of peripheral axes may be reset by collecting and averaging a plurality of measurements of the estimated contact force over a predetermined period of time.

An apparatus for leveling a superstrate with a substrate during a planarization process is provided. The apparatus includes a force controller, a position controller, and a force estimator. The force controller is configured to adjust a set point force based on an identified contact model and to adjust a set point position of position controller based on feedback control law and difference between set point force and estimated force required for performing the planarization process. The position controller is configured to adjust applied force to planarization head based feedback control law on difference between measured position and set point position which depends on output of the force controller and a parallel condition between two contacting surfaces. The position controller is also configured to receive information from an encoder for measuring positions along a plurality of peripheral axes, to send control information to a plurality of actuators for applying forces along the plurality of peripheral axes, and processing the parallel condition. The force estimator receives control effort information from the position controller, and is configured to provide calibrated spring force to estimate contact force using set point position as input and a contact force model configured to provide information indicating a relationship between a total contact force for the planarization process and a force component of the total contact force along each of a plurality of peripheral axes of a coordinate based on the adjusted set point position to identify a contact force model. The contact force model is identified based on a parallel condition between two contacting surfaces of a superstrate chuck for retaining the superstrate and a stack of the superstrate, the substrate, and formable material between the substrate and the superstrate.

The apparatus may further comprise an amplifier configured to rotate a contact curve smoothed by a digital filter with an amplifying position scale configured to detect a plurality of initial contact position for measuring the parallel condition. The position controller may further be configured to measure the parallel condition based on rotation of the stack.

A method of manufacturing an article is provided. In the method, a formable material is applied on a substrate. A planarization head is moved close to a proximity of contact surfaces between contact surfaces of a superstrate and a stack of a superstrate and the substrate. Force offsets is reset before contact between the superstrate and the substrate. A contact force mode indicating a relationship between a total contact force for planarization of a formable material between the superstrate and the substrate and a force component of the total contact force along each of a plurality peripheral axes is identified. A set point force required for performing the planarization is determined. Each force component is calculated based on the contact force model. planarization is performed by applying each force component along a corresponding axis of the plurality of axes. The contact force model may be identified based on a parallel condition between two contacting surfaces of a superstrate chuck for retaining the superstrate and a stack of the superstrate and the substrate. Each of the plurality of peripheral axes may extend in a parallel direction with respect to an axis in which a planarization head moves orthogonal to a reference plane. Each of the peripheral axes may be equidistant from a center of a superstrate chuck and are uniformly azimuthally distributed around a periphery of the stack of the superstrate, the substrate, and the formable material. The reference plane may be within 100 milliradians of parallelism with a top surface of a substrate chuck.

The total contact force may be estimated by measuring a force generated by an actuator along each of the plurality of axes at each of a plurality of positions along a first axis of the plurality of the axes; and adjusting the measured force to obtain an estimated contact force based on a calibrated spring force caused by a mechanical compliance force and the parallel condition. The mechanical compliance force may include spring forces. The spring forces may also be calibrated prior to performing planarization by the following steps. A planarization head including the superstrate chuck is moved to a first position above where the stack will be located when planarization is being performed. Positions and applied forces information of the planarization head after the planarization head settling down to the first position are gathered. The planarization head is moved to a second position below where the stack will be located when planarization is being performed. Positions and applied forces information of the planarization head after the planarization head settling down to the second position are gathered. The spring force based on the positions and applied forces information gathered from upward and downward movements of the planarization head. The calibrating force offsets of the plurality of axes may be reset by collecting and averaging a plurality of measurements of the estimated contact force over a predetermined period of time. The parallel condition between two contacted surface may be measured based on rotation of the stack about axes orthogonal to the displacement axis of the planarization head.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
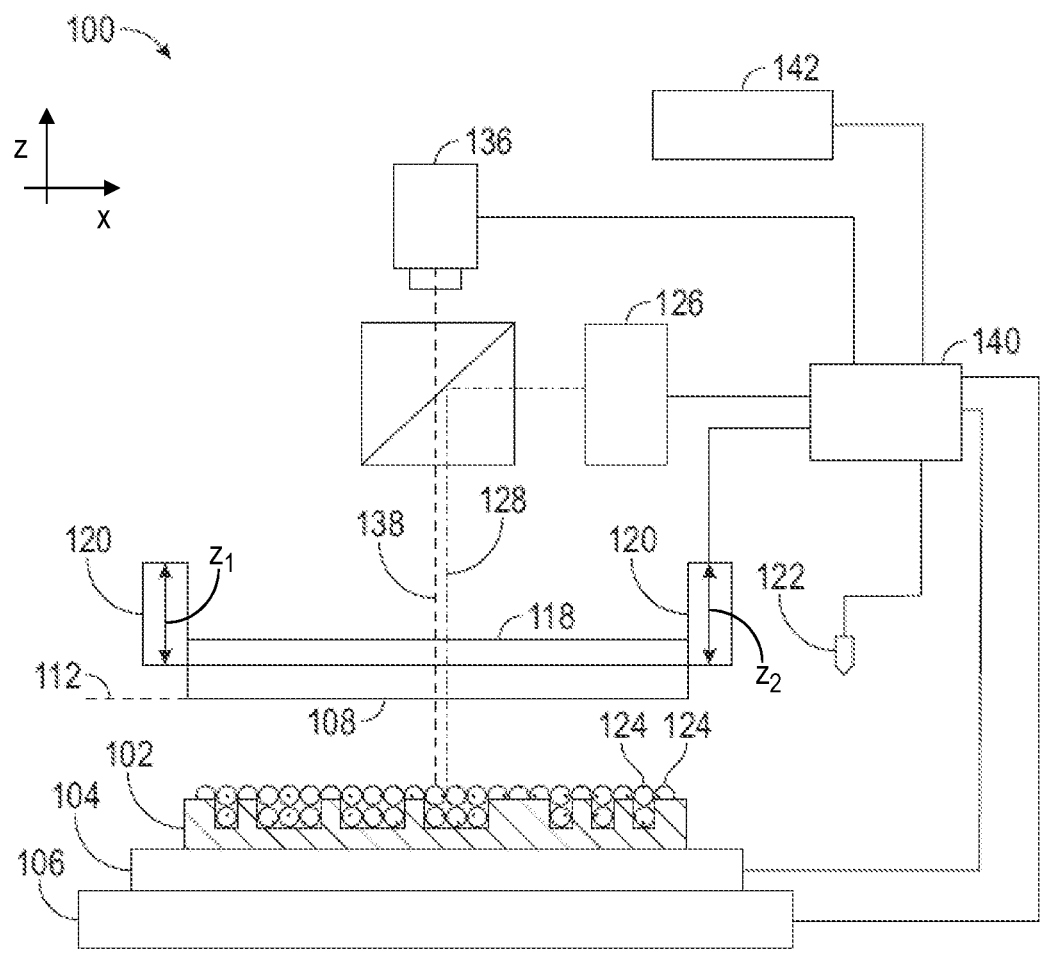
FIG. 1 is a diagram illustrating an apparatus.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

FIG. 1 illustrates an apparatus 100 that, among other things, can be used to planarize or shape a film on a substrate 102, for example, a wafer. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 having a working surface 112 facing substrate 102. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. Surface 112 is generally of the same areal size or slightly smaller as the surface of the substrate 102. Surface 112 of superstrate 108 can include a planar contact surface. In another embodiment, the contact surface 112 can include features that define any original pattern that forms the basis of a pattern to be formed on the substrate 102. In another embodiment, the superstrate 108 may be smaller than the substrate 102, and the planarization process is performed in a step and repeat manner.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck may be readily transparent to UV light. The superstrate chuck 118 may include a system such as a zone based vacuum chuck, an actuator array, a pressure bladder, etc., which can apply a pressure differential to a back surface of the superstrate 108 to cause the superstrate to bend and deform. In one embodiment, the superstrate chuck 118 includes a zone based vacuum chuck which can apply a pressure differential to a back surface of the superstrate, causing the superstrate to bend and deform as further detailed herein.

The superstrate chuck 118 may be coupled to a head 120 (also known as a planarization head, an imprint head, or a shaping head) which is a part of the positioning system. The head 120 may be movably coupled to a bridge (not shown). The head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis). For example, the head 120 may include: a first actuator that moves along a first z-axis that moves along a first z-axis $z_1$; a second actuator that moves along a second z-axis that moves along a second z-axis $z_2$; and a third actuator that moves along a third z-axis $z_3$. When all of the actuators displace the superstrate the same distance along the plurality of axes, then the superstrate does not tip or tilt. When the actuators cause an uneven amount displacement along each of the axes the tip and tilt of the superstate can be adjusted. There is a moving body plane that intersects with endpoints of each of the actuators the tip and tilt of this varies depending on the positions of the actuators along the plurality of peripheral axes. The plurality of peripheral axes may be equidistant from a center of the superstrate chuck 118. The plurality of peripheral axes may be uniformly azimuthally distributed around the periphery of the head 120 and a stack of the superstrate 108, the substrate 102, and the formable material 124. The moving body plane may be parallel to a chucking surface of the superstrate chuck 118. The working surface 112 is also parallel to the moving body plane. Each of the plurality of peripheral axes may extend in parallel with or azimuthally direction with respect to an axis orthogonal to a reference plane.

The apparatus 100 may further comprise a fluid dispenser 122. The fluid dispenser 122 may also be movably coupled to the bridge. In an embodiment, the fluid dispenser 122 and the head 120 share one or more of all positioning components. In an alternative embodiment, the fluid dispenser 122 and the head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The apparatus 100 further comprises a curing system that includes a radiation source 126 that directs actinic energy, for example, UV radiation, along an exposure path 128. The head 120 and the substrate positioning state 106 may be configured to position the superstrate 108 and the substrate 102 in superimposition with the exposure path 128. The radiation source 126 sends the actinic energy along the exposure path 128 after the superstrate 108 has contacted the formable material 128. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The apparatus 100 further comprises a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

The apparatus 100 may be regulated, controlled, and/or directed by one or more processors 140 (controller) in communication with one or more components and/or subsystems such as the substrate chuck 104, the substrate positioning stage 106, the superstrate chuck 118, the head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller.

Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, the planarization head 120, the substrate positioning stage 106, or both vary a distance between the superstrate 108 and the substrate 102 to define a desired space (a bounded physical extent in three dimensions) that is filled with the formable material 124. For example, the head 120 may be moved toward the substrate and apply a force to the superstrate 108 such that the superstrate contacts and spreads droplets of the formable material 124 as further detailed herein.

Planarization Process

Figure 2A:
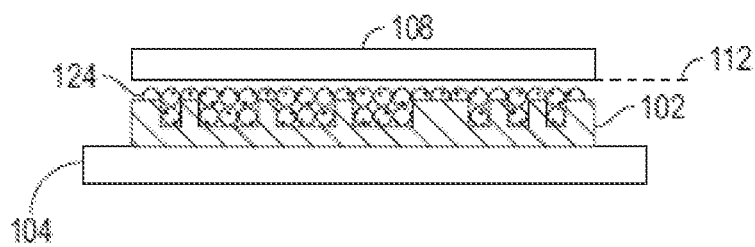
FIG. 2A to 2C illustrate a planarization process.
Figure 2B:
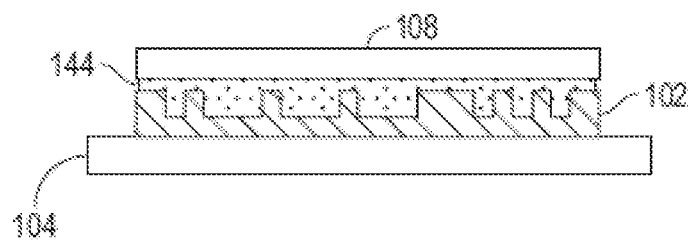
Figure 2C:
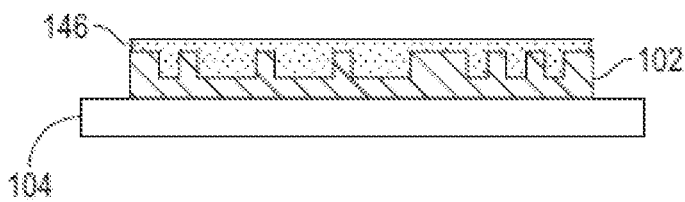

The planarization process includes steps which are shown schematically in FIGS. 2A-2C. As illustrated in FIG. 2A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124. In another embodiment, the superstrate 108 also has topography and the planarization process also includes forming features in the formable material.

FIG. 2B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2C illustrates the cured planarized layer 146 on the substrate 102 after separation of the superstrate 108.

In an alternative embodiment where the contact surface of superstrate 108 include pattern features, a similar process as described above can be performed to form a patterned layer on substrate 102 (e.g., "whole wafer" patterning). Whole wafer processing is useful in semiconductor device fabrication as well biological or optical device production. Such whole wafer processing can further be adapted such that local film thickness can be tuned as a function of desirable local film thickness.

During planarization spread, bending curvature of the superstrate may affect planarization throughput, and the contact line moving velocity of the formable material may have impact on residual layer thickness (RLT) uniformity. Planarization spread is a period of time during which formable material is 124 is being spread by capillary action and the curvature of the superstrate 108 to form an uncured planarization film. Before the superstrate 108 is in contact with the formable material 124 on the substrate 102, pressure may be applied at a middle zone 118M to bend the superstrate 108, then the working surface 112 may be moved towards the substrate 102. The superstrate may start to contact formable material 124 on the substrate 102 from the center of the substrate, then the contact line may smoothly move to the edge of the substrate by using multi-variable control, such as controlling the contact force, and the pressure applied to the middle zone 118M. At the end of the planarization spread, the superstrate 108 is in contact with the formable material 124 over the entire substrate and the superstrate conforms to the shape of the substrate.

While chucking and re-chucking the superstrate with the substrate, leveling between the superstrate and the substrate is one of critical requirements for planarization process. The parallel condition often affects the spread throughput. While re-chucking a stack of a superstrate, a substrate, and a cured formable material sandwiched between the superstrate and the substrate, vacuum pressure may bend the superstrate to generate a separation crack along the edge of the superstrate or to propagate initial crack generated by push pin to the edge of the superstrate. The bending moment may be significantly reduced by leakage caused by a gap between the stack and the superstrate chuck, which is sensitive to the parallel condition between the contact surfaces of the superstrate and the substrate. Therefore, the chucking contact condition mainly depends on the gap between the chucking surfaces of the stack and the superstrate chuck, which can be determined by relatively position and direction, that is, leveling offsets, between the chucking surfaces, especially at the edges of the chucking surfaces.

Superstrate Substrate Leveling System

Figure 3:
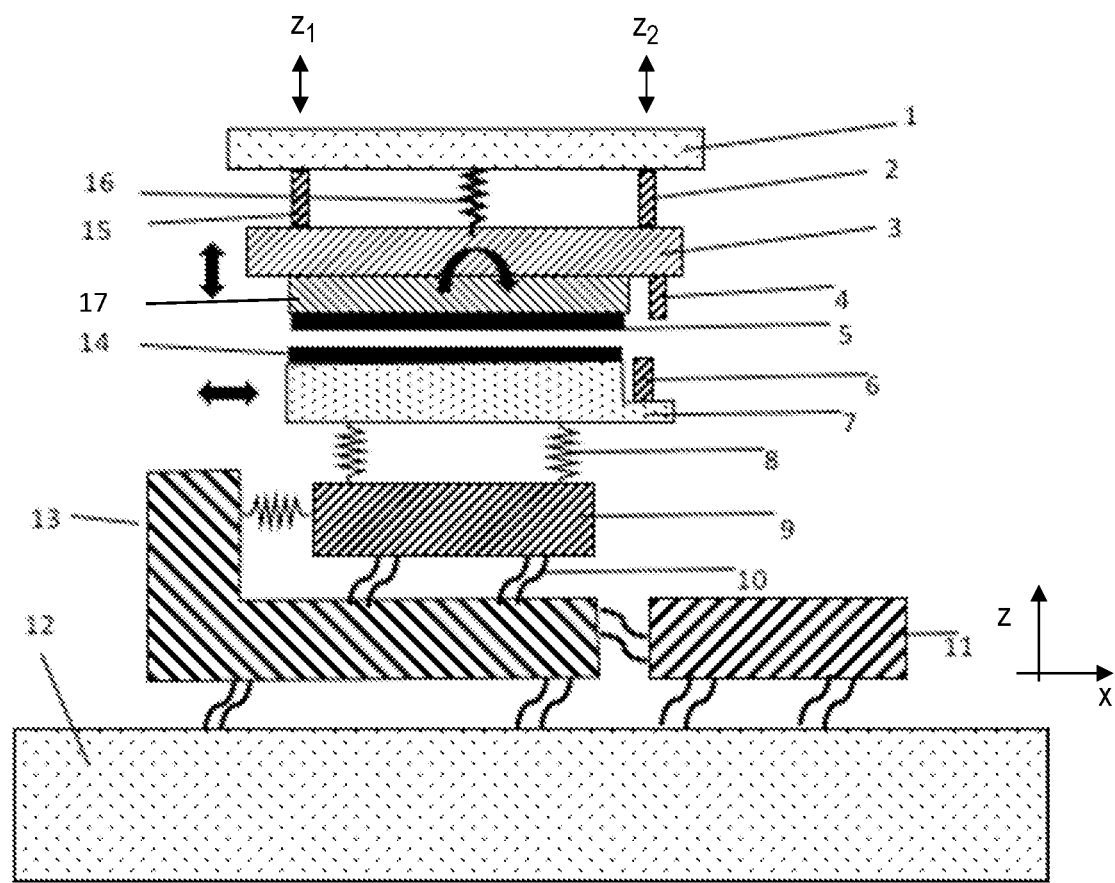
FIG. 3 illustrates an example of planarization control system to measure and control parallel condition between the superstrate and the substrate.

FIG. 3 illustrates a system for measuring and controlling the leveling offsets. The system is able to calculate and adjust the leveling offsets based on measurement results of the slopes of the contact surfaces of the template (superstrate) and the substrate using up-looking and down-looking non-contact sensors, and matching the surface slopes to adjust the leveling offsets. However, the leveling accuracy may still be limited by the flatness of the surfaces of the template and substrate, stage vertical error motion, sampling points, sensor accuracy, and other features. In addition, the measuring time increases quickly with the increase in the number sampling points and surface areas, which may have a significant impact on throughput.

As shown in FIG. 3, the real time leveling measurement and control system includes a planarization head that includes a fixed body 1 and a moving body 3. The fixed body 1 and the moving body 3 are connected with each other by a weight compensated spring and flexure 16. The movement of the moving body 3 of the planarization head may be detected and measured by the position sensors 2, and the movement of the moving body 3 may be controlled via actuators that move the superstrate along the plurality of z-axes ($z_1$, $z_2$, and $z_3$), the weight compensated spring and flexure 16 based on the measurement result of the position sensors 2. The planarization head further includes a superstrate chuck 17 for retaining a superstrate 5 which may be planar or which may include a pattern to be transferred to a formable material formed on a substrate of a substrate 14. The substrate 14 is retained with a substrate chuck 7 which may be mounted onto an XYθ stage. The XYθ stage includes a theta stage 9 supporting and controlling the substrate 14 via mechanical compliant members 8, a Y stage 13 connected with the theta stage 9 via both mechanical compliant member 8 and air bearing members 10, and a Y stage 13 connected to the X stage 11 via air bearing members 10. Both the X stage 11 and the Y stage 13 are disposed on a granite table 12 via air bearing members 10. The body of the superstrate 5 may have a thickness in a range of 30 microns to 2000 microns. In one embodiment, the substrate 14 and superstrate 5 may have a 300 mm diameter. Each of the substrate 5 and the superstrate 14 may have a diameter between 300 mm and 600 mm. Alternatively, diameters of the substrate 5 and superstrate 14 may be between 300 mm and 450 mm. In another embodiment, diameters of the substrate 5 and superstrate 14 may be between 450 mm and 600 mm.

Figure 4:
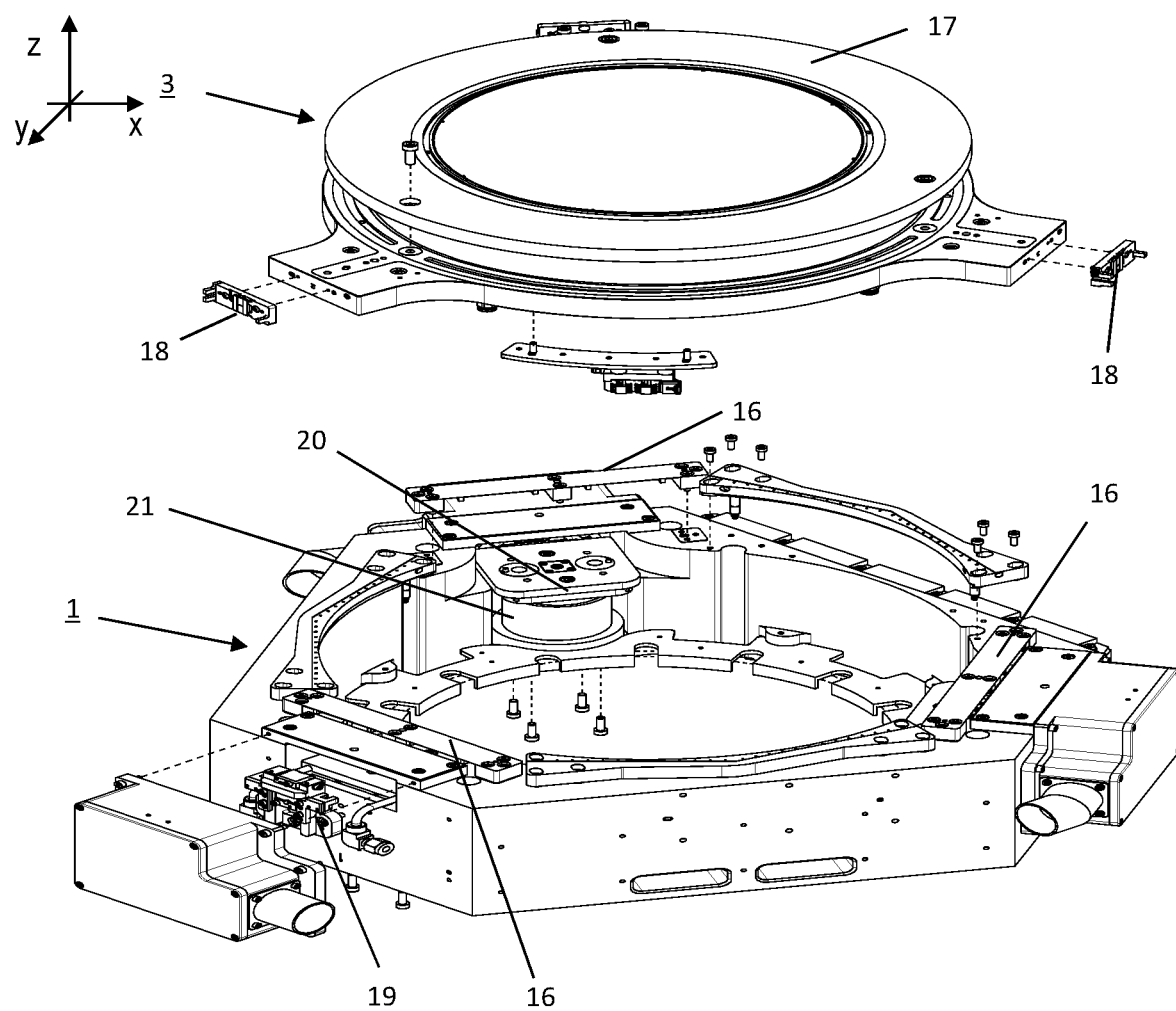
FIG. 4 is an exploded view of the planarization head control system as shown FIG. 3.

While chucking and un-chucking, the superstrate chuck 17 may be moved up and down and swung about a reference plane, for example, a plane defined by an X-axis and a Y-axis. The movement of the superstrate chuck 17 may be detected and measured by a down looking displacement sensor 4 mounted on a contact surface of the moving body 3 of the planarization head and an up looking displacement sensor 6 mounted on a recessed peripheral region of the substrate chuck 7. FIG. 4 shows an exploded view diagram of the real time leveling measurement and control system illustrated in FIG. 3. Multiple encoders 15 for sensing position of the planarization head moving body 3 along multiple parallel axes are installed at the periphery of the planarization head. Each of the encoders 15 may include an encoder scale 18 attached to a periphery of the moving body 3 and an encoder sensor head 19 at a periphery of the fixed body 1. The system includes multiple actuators for generating force along multiple parallel axes for performing planarization. Each of the actuators may include a magnet 20 and a voice coil 21. The contact force generated by the actuators can be measured based on the current flow through the voice coil 21 or may be determined based on control effort information sent to the actuators by the processor 140 or a position controller. A flexure 16 may be installed on the surface of the fixed body 1 and the moving body 3 for guiding motion and providing compliance between the fixed body 1 and the moving body 3. The plurality of peripheral axes may extend in a parallel direction with respect to an axis along which the planarization head moves orthogonal to a reference plane. The reference plane may be defined by bearing points of each of the flexures 16 associated with each of the actuators. The reference plane may be substantially parallel to a top surface of the substrate chuck. Substantially parallel may within 100 milliradians of parallelism.

Contact Force Estimation

Figure 5:
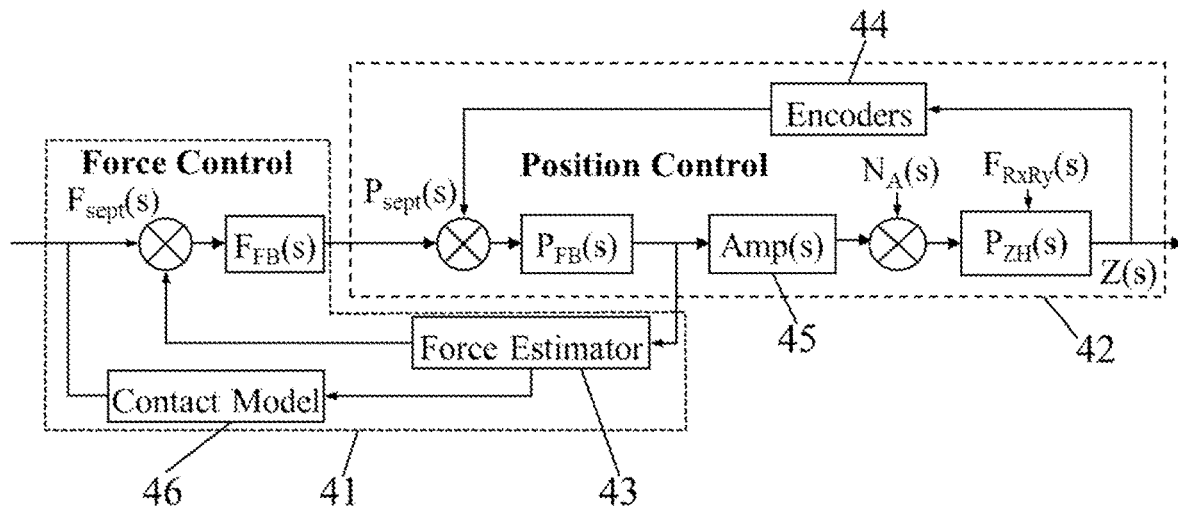
FIG. 5 is a schematic diagram of a control system for measuring and controlling leveling condition based on estimated force using hybrid force-position control scheme.

As the compliance of the whole stack that includes at least the superstrate and the substrate includes mechanical compliance and air bearing, the estimated contact force between the superstrate 5 and the substrate 14 depends on the compliance and the leveling (parallel condition) between the superstrate 5 and the substrate 14. A force based leveling control system that measures and controls leveling offsets based on estimated force using a hybrid force-position control scheme is illustrated in FIG. 5. The hybrid control system includes a force controller 41 and a position controller 42. As shown in FIG. 5, a set point force $F_{sept}(s)$ required for performing spread of the formable material on the substrate is input to the force controller 41, where s is the complex variable and $F_{sept}(s)$ represents a Laplace transform of a time series of setpoint force values. The set point force $F_{sept}(s)$ may be a function (a linear function, a non-linear function, or via a calibration table) of the current that flows through the voice coils 21 as shown in FIG. 4. $F_{FB}(s)$ generates output to the position controller 42 based on feedback control law and a difference between setpoint force and an estimated contact force which is the setpoint position input of the position controller 42." The feedback control law is a mathematical formula or look up table used by the position controller to determine an output based on one or more inputs. The control law may take into account the current inputs, past inputs, and predicted future inputs. $P_{FB}(s)$ generates an applied force to planarization head based on feedback control law and difference between measured position by encoder and set point position $P_{sept}(s)$ obtained from the force controller 41. The set point position $P_{sept}(s)$ can also be adjusted by the position offset that restores and/or maintains the parallel condition between two contact surfaces (for example of the superstrate chuck and the stack of the superstrate and the substrate) fed back from encoders 44, for example, the encoders that include the encoder scales 18 and the encoder sensor heads 19 as shown in FIG. 4. During rechucking, the two contact surfaces may include: a chucking surface of the superstrate chuck that comes into contact with a back surface of the superstrate; and a back surface of the superstrate opposite the working surface on a stack that includes the superstrate 108, cured planarized layer 146, and the substrate 102. Prior to curing the formable material, the two contact surfaces may include: a working surface 112 of the superstrate 108; and a surface of the substrate 102 on which formable material 124 has been deposited. The output of the force estimator 43 is also used to identify a contact model 46, allowing a real time adjustment of contact force along each of the axes, so as to perform a real time leveling control and measurement. The set point force $F_{FB}(s)$ is adjusted based on information from both the contact model 46 and feedback from the force estimator 43.

To estimate contact force and reset force offset scheme, a contact force at a given height position Z of the planarization head along a plurality of peripheral axes ($z_i$) may be estimated as:

$$F_m(z_i) = F_f(z_i) - F_{cal}(z_i) - F_{offset}(z_i) \qquad (1),$$

where Z is a height of the planarization head along the displacement direction or displacement axis (Z-axis) of the planarization head with respect to the stack of the superstrate, cured formable material and the substrate;

$z_i$ is an axis extending substantially parallel with respect to the Z-axis and intersecting with a peripheral position of the stack;

i denotes an index of each of the peripheral z axes;

$F_m(z_i)$ denotes estimated force at the given position $z_i$ and the height Z of the planarization head;

$F_f(z_i)$ denotes the force generated from each voice coil, which is a function of (proportional to) the current flow through one of the voice coils at a given position of each z axis which is subject to disturbance;

$F_{cal}(z_i)$ denotes spring force at the given position $z_i$ of each z axis; and $F_{offset}(z_i)$ denotes force offset of each z axis to compensate for disturbance at steady state. The spring force $F_{cal}(z_i)$ and offset force $F_{offset}(z_i)$ are calibrated and reset based on definition of contact force which is zero when there is no contact between the superstrate and the substrate. The force offsets are stored in a computer memory to handle quasi-static disturbance which are set to zero at the start of the tool control system. Each of the forces is a set with one element for each z axis. For example, if there are three peripheral z-axes then there are three elements associated with each force, one for each of the three peripheral z-axes.

Figure 7:
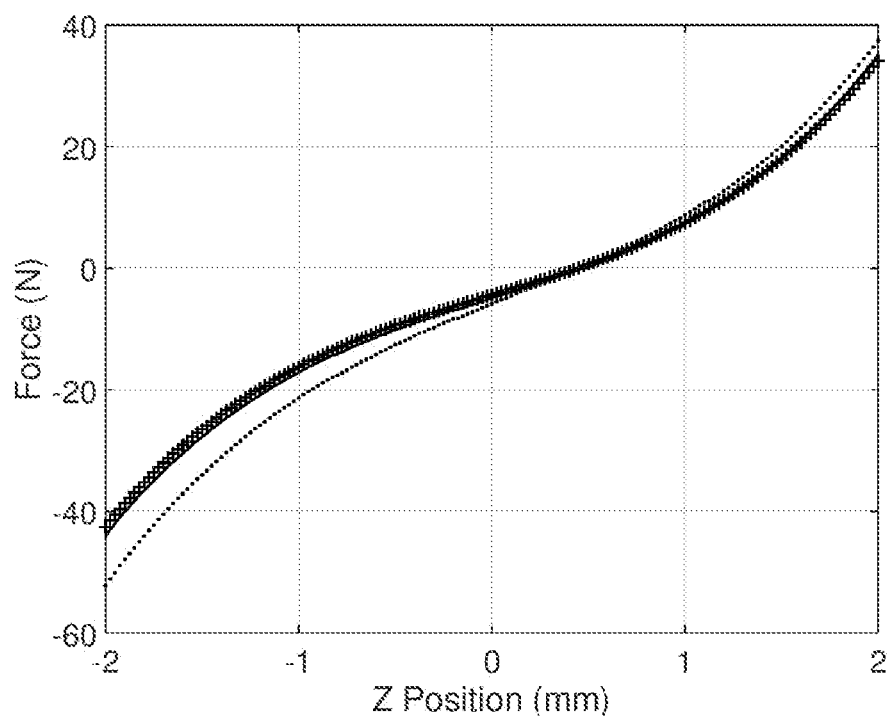
FIG. 7 shows an example of the graph of spring force calibration results.

The spring force $F_{cal}(z_i)$ can be calibrated statically or dynamically. To calibrate the spring force statically, the planarization head, that is, the planarization head may be moved to for example a position about 0.3 mm above a planarization up plane. The planarization up plane is a position 0.1-10 mm above the planarization plane and is a position at which the working surface 112 is held prior to planarization for safety of other operations for example during dispense or substrate loading. The position information and control information (information of forces applied for control) along three peripheral axes are gathered until the planarization head settles down. The control information is representative of $F_f(z_i)$. The control information may be equal to, proportional to, or a function of the current (as measured or instructed) supplied to each voice coil. Depending on the motion damping condition of the planarization head the settling time may be from 0.001-10 seconds for the planarization head to settle down, as long as there is no longer acceleration or deceleration of the working surface. The planarization head is then moved downwards with a configured step, for example, 0.025 mm to a measurement position. The control information is then gathered after the planarization head has settled down to a parallel condition at the measuring position as indicated by the encoders 44. The movement and gathering of control information are repeated until reaching a position about 0.3 mm below the planarization plane. The calibration sample results of the spring force $F_{cal}(z_i)$ are illustrated as shown in FIG. 7. To calibrate the spring force dynamically, the planarization head is moved to a position 0.3 mm above the planarization up plane, and then moved to a position about 0.3 mm below the planarization plane with a constant slow speed, for example, 0.1 mm/sec to minimize impact of acceleration on the measurement. The position information and control information of the planarization head along the three peripheral axes are gathered during the movement and used for calibrating the spring force dynamically. The spring force $F_{cal}(z_i)$ is calibrated in such a manner that the working surface 112 never comes into contact with another surface. Contact may be prevented for example by lowering the substrate chuck 104 relative to the working surface 112 or translating the substrate chuck 104 away from the working surface 112.

When there is a dynamic or quasi-static disturbance and the superstrate and substrate are not in contact with each other, the estimated forces at the positions $z_i$, $F_m(z_i)$, are no longer zero. The force offsets are updated to make sure the force $F_m(z_i)$ is equal to zero.

$$F_{offset\_update}(z_i) = F_m(z_i) + F_{offset}(z_i) \quad (2),$$

where updated force offsets $F_{offset\_update}(z_i)$ updates the previous force offsets $F_{offset}(z_i)$. To smooth measurement noise, about 100 measured force values $F_m(z_i)$ may be collected over a couple of milliseconds to smooth out measurement noise.

Figure 6:
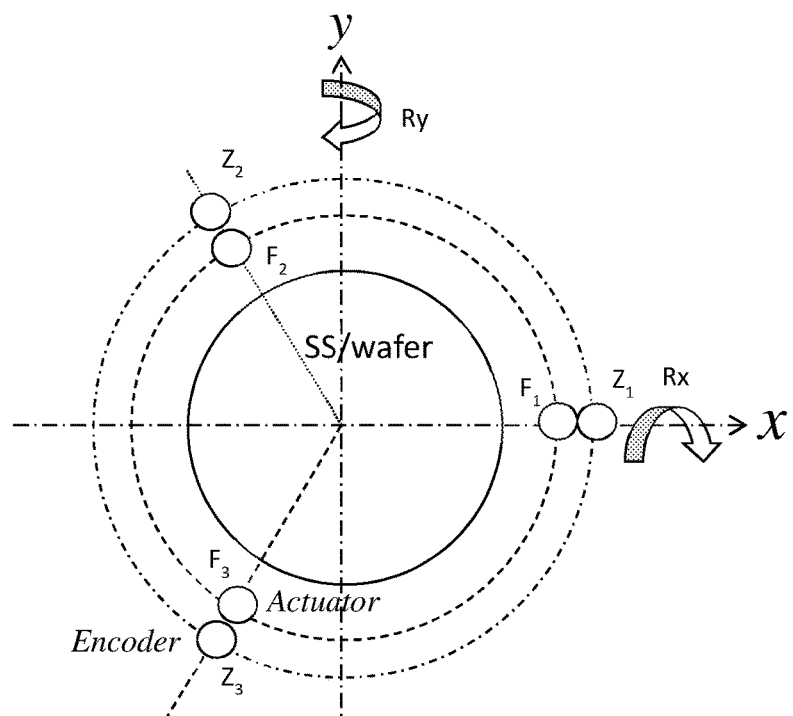
FIG. 6 shows a layout to control the leveling condition based on contact force.

To determine the leveling condition (parallel condition) between the superstrate and the substrate it is also useful to understand the tip tilt of the moving body 3 and the working surface 112 as described by $R_x$ and $R_y$ are used by the position controller 42 as shown in FIG. 4, the tip-tilt $R_x$ and $R_y$ of the moving body 3 and the working surface 112 X-axis and Y-axis, respectively, at Z position are measured and controlled by three peripheral z-axis position control system as shown in FIG. 6. Referring to both FIGS. 4 and 6, the three actuators at positions close to sensor location $z_1$, $z_2$, and $z_3$ generate forces $F_1$, $F_2$, and $F_3$ that are exerted on the moving body which is transferred to the working surface 112 during planarization and to the stack of superstrate, formable material and wafer (substrate) during rechucking. The contact forces may be detected after subtracting spring forces and resetting quasi-static force disturbance generated from planarization module environment. The Z position at the center of superstrate chuck at xy plane and relative rotations $R_x$ and $R_y$ of the moving body 3 and the fixed body 1 can be expressed as:

$$\begin{pmatrix} Z \\ R_x \\ R_y \end{pmatrix} = \begin{pmatrix} 1 & y_{s_1} & x_{s_1} \\ 1 & y_{s_2} & x_{s_2} \\ 1 & y_{s_3} & x_{s_3} \end{pmatrix} \begin{pmatrix} z_1 \\ z_2 \\ z_3 \end{pmatrix}, \quad (3)$$

$x_{s_i} = r_s \cos \theta_i$, $y_{s_i} = r_s \sin \theta_i$, i=1, 2, 3, where
$z_i$ denotes the position along z-axis measured by the position sensors, and
$r_s$ denotes the radial distance from the sensor to the center of the substrate.

Theoretically, when two contact surfaces of the superstrate and substrate are perfectly parallel with each other, the three contact forces estimated from forces generated by each of the actuators should be identical. The measurement sensitivity to the parallel condition based on contact force difference is proportional to substrate radius. Therefore, the sensitivity can be increased by reducing radial distance from substrate edge to the center of each actuator, for example, to about 70 mm due to space limitation. On the planarization tool, the three forces are different as shown in FIG. 7 even if the two contact surfaces are exactly parallel. The contact forces depend on location of the actuators, location of the position sensors or encoder, flatness of two contacted surfaces, and compliance of the whole planarization module. The accurate contact force model can improve leveling control accuracy based on force control. The top surface of the superstrate chuck and the stack of superstrate and substrate chucked on the substrate chuck can be used to identify a contact model to minimize impact caused by flatness of the superstrate and substrate, and the shape of the substrate and superstrate in a free state. The superstrate and the substrate are both in contact with formable material 124 sandwiched between them to minimize the impact from flatness of contacted surfaces of the superstrate and substrate, which is the same condition for planarization process.

Figure 8:
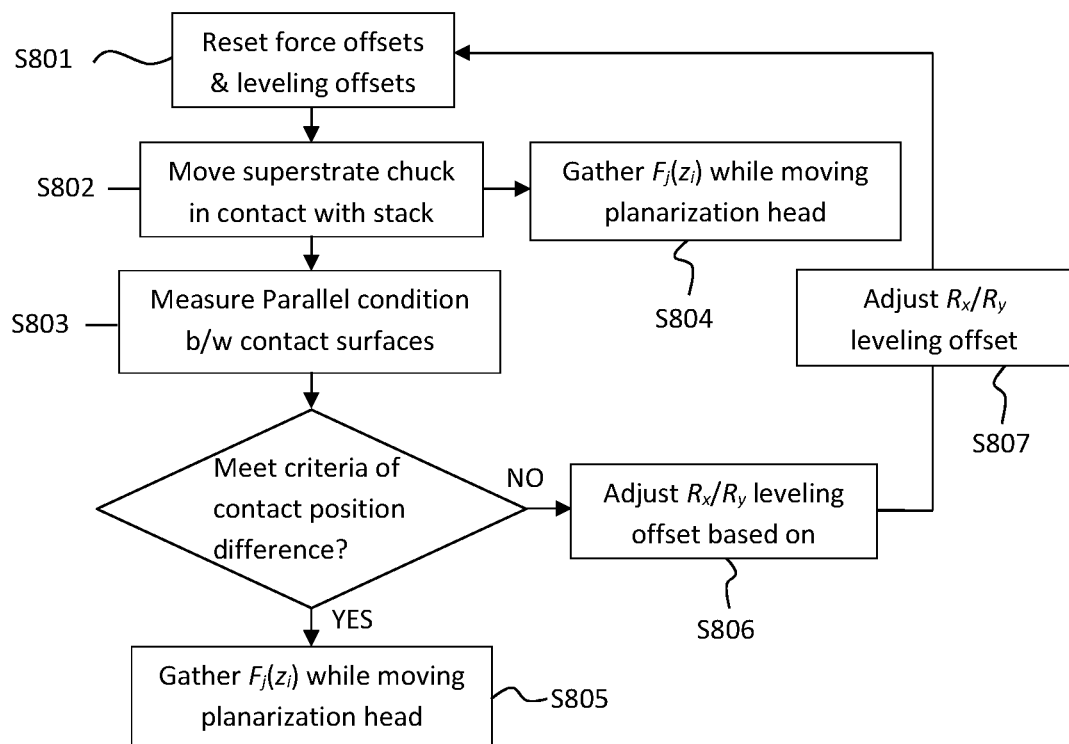
FIG. 8 shows the method of identifying a contact model for real time leveling control for planarization.
Figure 9:
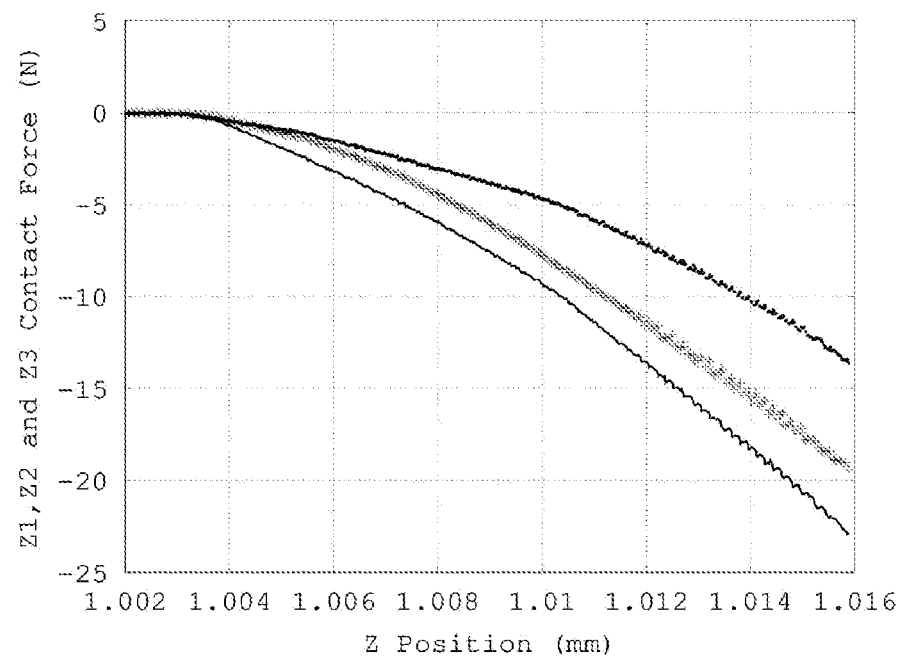
FIG. 9 shows the contact force curves used to measure the parallel condition and identify the contact force model.
Figure 10:
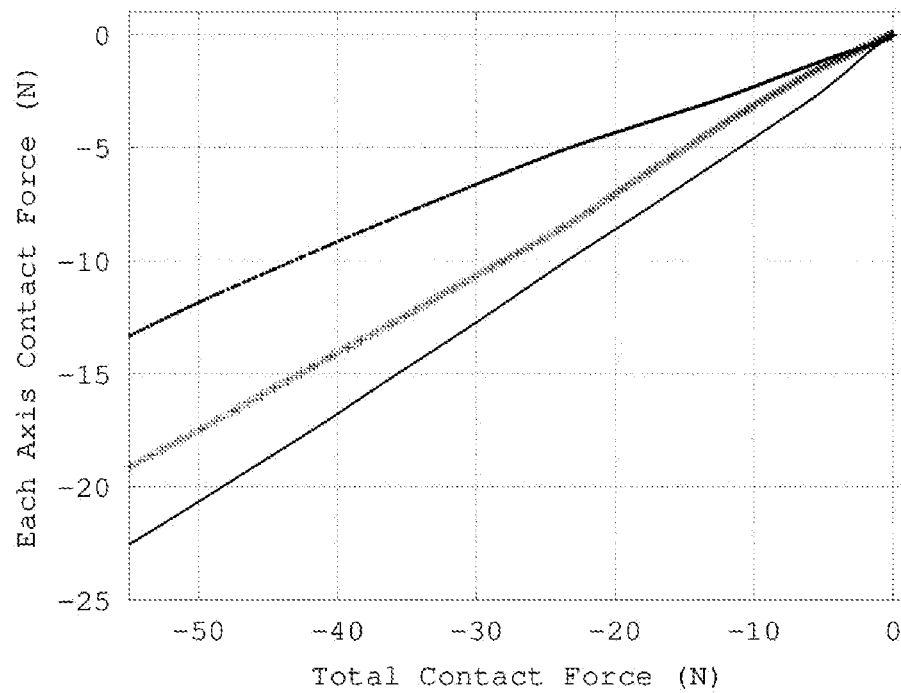
FIG. 10 shows graphs of smoothed and transformed contact force curves along three axes at a given Z position.

FIG. 8 shows the process to identify a contact model using the hybrid control system as shown in FIG. 4. In step S801, the planarization head is moved close to a proximity of contacting surfaces between the superstrate chuck and the stack of the superstrate 108, the formable material 124, and the substrate 102, without contact. In step S802, the superstrate chuck is moved smoothly with a velocity of about 0.01 to 0.1 mm/sec to be in contact with the stack. During the movement in step S802, the contact force curve of $F_i(z_i)$ (i=1, 2, 3) is measured (step S803). In step S804, the parallel condition between two contact surfaces of the superstrate and the substrate is measured based on an initial contact position of each of the three axes. According to the contact force curve $F_i(z_i)$, for example, the curves as shown in FIG. 9, the contact force $F_i(z_i)$ along each axis is zero when there is no contact between the contact surfaces. The contact force increases gradually when the planarization head is continuously moved towards the stack. The contact force distribution depends on the parallel condition between the contact surfaces and compliance after contact. When the two contact surfaces are parallel with each other, the initial contact positions along the three axes should be the same and there is no impact from compliance difference. Therefore, the initial contact position can be used to measure the parallel condition, for example, by the position controller 42 as shown in FIG. 4. The measurement accuracy depends on accuracy of the initial contact position detection, which can be identified by the steps as shown in FIG. 10, which will be discussed later. If the measured parallel condition includes a contact position difference are within a predetermined level, for example, smaller than 0.0001 mm to 0.001 mm, step S805 is performed. Otherwise, steps S806 and S807 are performed. In step S806, leveling offsets $R_x$ and $R_y$ are adjusted based on the contact position difference using formula (3) presented above. The planarization head is then moved back to the proximity plane in step S807, and the process returns to step S801.

If the contact position difference is out of the predetermined level in step S804, step S805 is performed by using the contact force curve obtained from steps S802 and S303 after two contact surfaces parallel to model contact force with piecewise cubic polynomial coefficients $a_{i,j}$, $b_{i,j}$, $c_{i,j}$, $d_{i,j}$, which are solved by least square method to minimize impact from measured noise for each contact force associated with each of the peripheral z axes. The piecewise cubic polynomials should be continuous across the first and second derivatives relative to the z coordinate axes.

$$F_i(z_i) = \begin{cases} F_{i,0}(z_i) = a_{i,0}z_i^3 + b_{i,0}z_i^2 + c_{i,0}z_i + d_{i,0}, & z_{i,0} \leq z_i \leq z_{i,1} \\ F_{i,j}(z_i) = a_{i,j}z_i^3 + b_{i,j}z_i^2 + c_{i,j}z_i + d_{i,j}, & z_{i,j-1} \leq z_i \leq z_{i,j} \quad i = 1, \\ F_{i,n-1}(z_i) = a_{i,n-1}z_i^3 + b_{i,n-1}z_i^2 + c_{i,n-1}z_i + d_{i,n-1}, & z_{i,n-1} \leq z_i \leq z_{i,n} \end{cases}$$

2, 3.

which satisfies $$F_{i,j}(z_i) \in C^2[z_{i,0}, z_{i,n}] : \begin{cases} F_{i,j-1}(z_{i,n}) = F_{i,j}(z_{i,n}) \\ F'_{i,j-1}(z_{i,n}) = F'_{i,j}(z_{i,n}) \\ F''_{i,j-1}(z_{i,n}) = F''_{i,j}(z_{i,n}) \end{cases} j = 1,$$

2, 3, ..., $n-1$, $i = 1, 2, 3$.

In which the positions $z_{i,j}$ refer to an jth position along an ith z axis at which pieces of the piecewise functions connect. The contact force curve $F_i(z)$, for example, the curves as shown in FIG. 10, is then used to model force distribution along each axis caused by compliance with a desired total contact force, that is, the sum of force along each axis, as input.

Figure 11:
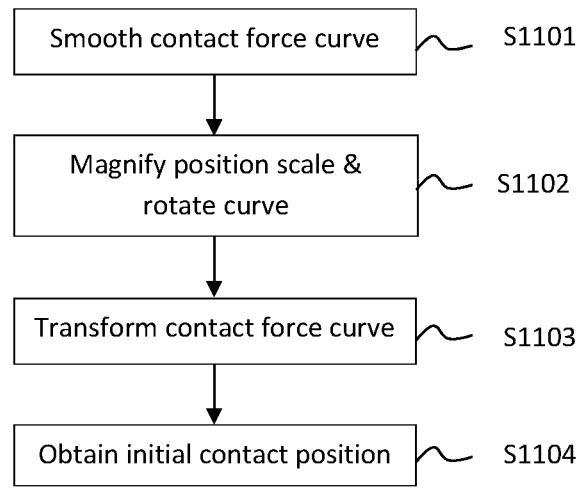
FIG. 11 shows a method for measuring the level condition.
Figure 12:
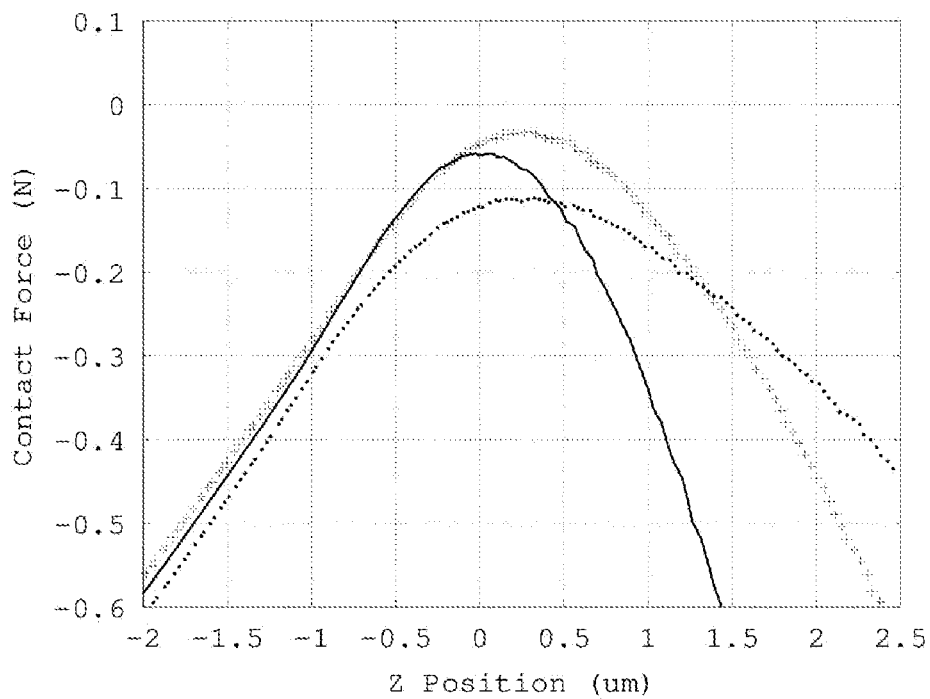
FIG. 12 shows a graph of detected initial contact position with smoothed and transformed contact force curve.

FIG. 11 shows the process for measuring the initial contact position in step S804 as shown in FIG. 8. In step S1101, the contact force curve is smoothed by a digital filter. In one embodiment, filter coefficients can be obtained by fitting successive sub-sets of adjacent data points with a low-degree polynomial by the method of linear least squares. In step S1102, a position scale is magnified or amplified with a coefficient $S_c$, and the contact force curve is rotated counterclockwise with an angle θ by coordinate transform as:

$z_{T_i} = z_i S_c \cos\theta + F(z_i)\sin\theta$ $F_T(z_i) = -z_i S_c \sin\theta + F(z_i)\cos\theta$ In step S1103, the initial position can be found by location of the maximum force in the transformed contact force curve as shown in FIG. 12. The initial contact position can then be obtained by reversing the coordinate transform in step S1104.

Figure 13:
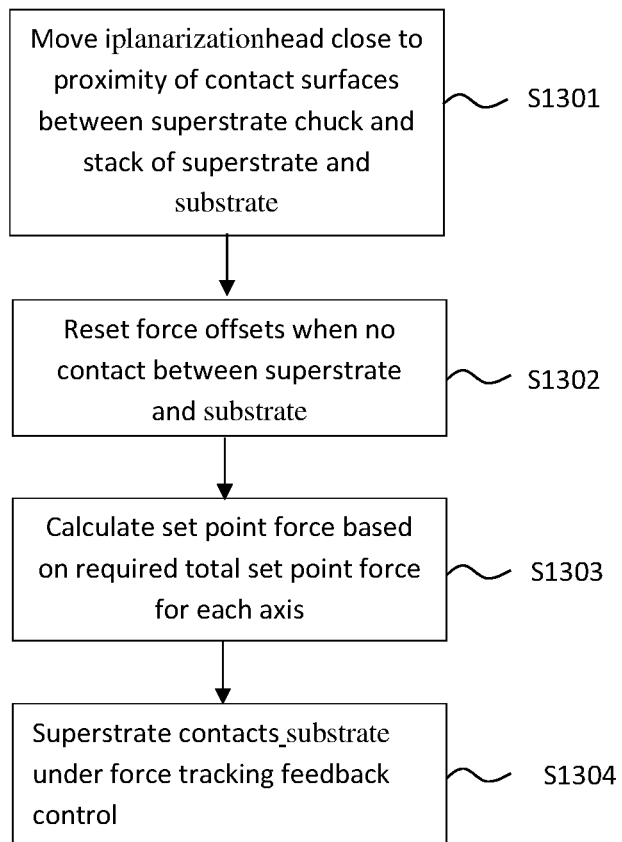
FIG. 13 shows the method of real time leveling control for planarization.

The contact force model as shown in FIG. 10 provides the information of how the set point force $F_{sept}$ is distributed along three axes. By adjusting the force distributed along each axis, a real-time leveling control during the spreading of formable material can be achieved. FIG. 13 shows the processes of a method for real-time leveling control during spread. In step S1301, the planarization head 120 is moved close to a proximity of the contact surfaces between the superstrate chuck and the stack of the superstrate and the substrate. In step S1202, the force offsets are reset when there is no contact between the superstrate and the substrate. In step S1203, the set point force $F_{sept}$ is dynamically adjusted based on the identified contact model as shown in FIG. 10. More specifically, based on the required total set point force, the set point force along each of the three axes can be calculated with spline interpolation. In step S1304, the superstrate is smoothly in contact with the substrate under the force tracking feedback control. After the working surface 122 is brought into contact with the formable material 124, the deviation from the parallel condition state of the working surface 122 relative to the substrate 102 can be determined based on the contact model. This information can then be used improve the parallel condition state of the working surface 122 relative to the substrate 102 while formable material spreads underneath the superstrate 108 so that the parallel condition is achieved when the formable material is cured.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of leveling control between a superstrate and a substrate, comprising:
   identifying a contact force model indicating a relationship between a total contact force for planarization of a formable material between the superstrate and the substrate and a force component of the total contact force along each of a plurality of peripheral axes; and
   determining a set point force required for performing the planarization;
   calculating each force component based on the contact force model; and
   performing planarization by applying each force component along a corresponding axis of the plurality of peripheral axes;
   wherein the contact force model is identified based on a parallel condition between two contacting surfaces of:
   a superstrate chuck for retaining the superstrate; and
   a stack of the superstrate, the substrate, and formable material between the superstrate and the substrate.

2. The method of claim 1, wherein each of the plurality of peripheral axes extend in a parallel direction with respect to an axis along which a planarization head moves orthogonal to a reference plane.

3. The method of claim 2, wherein each of the peripheral axes are equidistant from a center of a superstrate chuck and are uniformly azimuthally distributed around a periphery of the stack of the superstrate, the substrate, and the formable material.

4. The method of claim 2, wherein the reference plane is within 100 milliradians of parallelism with a top surface of a substrate chuck.

5. The method of claim 1, further comprising estimating force components of the total contact force by:
   measuring a force generated by an actuator along each of the plurality of peripheral axes at each of a plurality of positions along a first axis of the plurality of the peripheral axes; and
   adjusting the measured force to obtain an estimated contact force based on a calibrated spring forces caused by a mechanical compliance force and the parallel condition.

6. The method of claim 5, wherein the mechanical compliance force includes spring forces.

7. The method of claim 6, further comprising estimating the calibrated spring forces, prior to performing planarization by:
   moving a planarization head including the superstrate chuck to a first position above where the stack is to be located when planarization is being performed;
   gathering positions and information of applied control forces of the planarization head after the planarization head settling down to the first position;
   moving the planarization head to a second position below where the stack will be located when planarization is being performed;
   gathering positions and applied forces information of the planarization head after the planarization head settling down to the second position; and
   calibrating the spring force based on the position and applied forces information gathered from upward and downward movements of the planarization head.

8. The method of claim 6, wherein calibrating the spring forces further comprises moving the planarization head and a substrate chuck for holding the substrate away from each other prior to moving the planarization head.

9. The method of claim 5, further comprising resetting the calibrated spring forces of the plurality of peripheral axes by collecting and averaging a plurality of measurements of the estimated contact force over a predetermined period of time.

10. A method of manufacturing an article, comprising:
    applying a formable material on a substrate;
    moving planarization head close to a proximity of contact surfaces between contact surfaces of a superstrate and a stack of a superstrate and the substrate;
    resetting force offsets before contact between the superstrate and the substrate;
    identifying a contact force mode indicating a relationship between a total contact force for planarization of a formable material between the superstrate and the substrate and a force component of the total contact force along each of a plurality peripheral axes; and
    determining a set point force required for performing the planarization;
    calculating each force component based on the contact force model; and
    performing planarization by applying each force component along a corresponding axis of the plurality of axes;
    wherein the contact force model is identified based on a parallel condition between two contacting surfaces of:
    a superstrate chuck for retaining the superstrate; and
    a stack of the superstrate and the substrate.

11. The method of claim 10, wherein each of the plurality of peripheral axes extends in parallel with a displacement axis along which the planarization head moves.

12. The method of claim 11, further comprising estimating the total contact force by:
    measuring a force generated by an actuator along each of the plurality of axes at each of a plurality of positions along a first axis of the plurality of the axes; and
    adjusting the measured force to obtain an estimated contact force based on a calibrated spring force caused by a mechanical compliance force and the parallel condition.

13. The method of claim 12, wherein the mechanical compliance force includes spring forces.

14. The method of claim 13, further comprising calibrating the spring forces, prior to performing planarization by:
    moving a planarization head including the superstrate chuck to a first position above where the stack will be located when planarization is being performed;
    gathering positions and applied forces information of the planarization head after the planarization head settling down to the first position;
    moving the planarization head to a second position below where the stack will be located when planarization is being performed;
    gathering positions and applied forces information of the planarization head after the planarization head settling down to the second position; and
    calibrating the spring force based on the positions and applied forces information gathered from upward and downward movements of the planarization head.

15. The method of claim 12, further comprising resetting the calibrating force offsets of the plurality of axes by collecting and averaging a plurality of measurements of the estimated contact force over a predetermined period of time.

16. The method of claim 12, further comprising measuring the parallel condition between two contacted surface based on rotation of the stack about axes orthogonal to the displacement axis of the planarization head.

* * * * *